United States Patent [19]

Cavallini

[11] Patent Number: 4,544,069

[45] Date of Patent: Oct. 1, 1985

[54] MODULAR ELEMENTS FOR COMPOSING FRAMES FOR THE CONSTRUCTION OF CABINET STRUCTURES AND CONTAINERS FOR ELECTRICAL, ELECTROMECHANICAL AND ELECTRONIC COMPONENTS, FOR INTERNAL AND EXTERNAL USE

[76] Inventor: Gianfranco Cavallini, Via Rieti, 23, 10095 Grugliasco, Torino, Italy

[21] Appl. No.: 608,236

[22] Filed: May 8, 1984

[30] Foreign Application Priority Data

May 26, 1983 [IT] Italy .............................. 53387/83[U]

[51] Int. Cl.⁴ .............................................. A47F 5/00
[52] U.S. Cl. ..................................... 211/183; 403/172
[58] Field of Search ................ 211/183, 182; 403/172, 403/176, 295, 403; 108/111, 107, 153; 312/257 SK

[56] References Cited

U.S. PATENT DOCUMENTS 2,904,360 9/1959 Gamlen ............................ 403/172 X
2,956,705 10/1960 Clingman ........................ 403/172 X

FOREIGN PATENT DOCUMENTS 1665772 1/1971 Fed. Rep. of Germany .
2654239 6/1978 Fed. Rep. of Germany .
2731328 2/1979 Fed. Rep. of Germany .
1276390 10/1961 France .
1454278 8/1966 France .
508293 7/1971 Switzerland .

Primary Examiner—Peter M. Caun
Assistant Examiner—Sarah A. Lechok
Attorney, Agent, or Firm—Young & Thompson

[57] ABSTRACT

Modular elements for composing frame for the construction of cabinet structures and containers for electrical, electromechanical and electronic components, for internal and external use, wherein said elements form the perimetral cabinet frame defined by section bars (10, 10') and angle pieces (19, 19', 19") connected together; the angle pieces (19, 19', 19") are constituted by a corner portion (20, 20', 20") from which there extend several mutually orthogonal tube portions (21, 21', 21") of substantially quadrilateral cross-section; the section bars (10, 10') are constituted by tubular elements arranged for insertion onto said tube portions (20, 20', 20") and comprising, extending from one corner (11) thereof in mutually orthogonal directions, two flanges (12) from which there extend two further converging flanges (14) from which there extend two mutually orthogonal profiled portions (16) which can be provided with standardized holes (17) arranged for supporting electronic and electromechanical containers.

9 Claims, 15 Drawing Figures

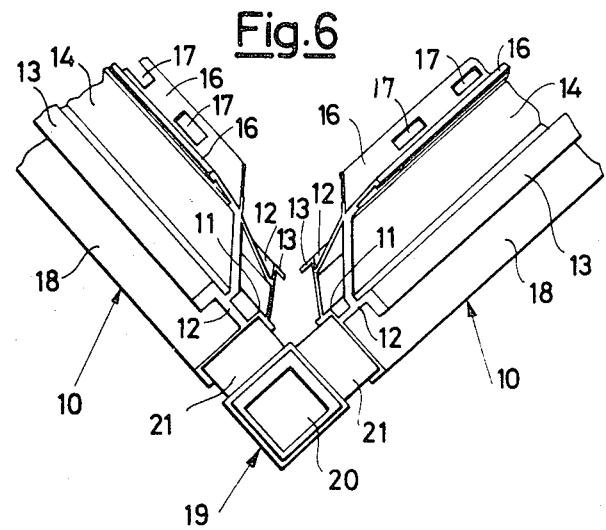
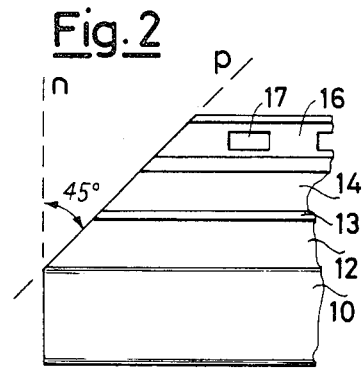
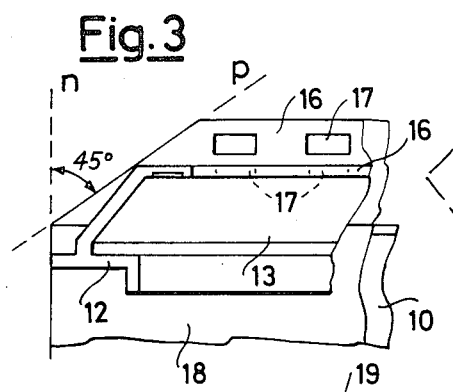
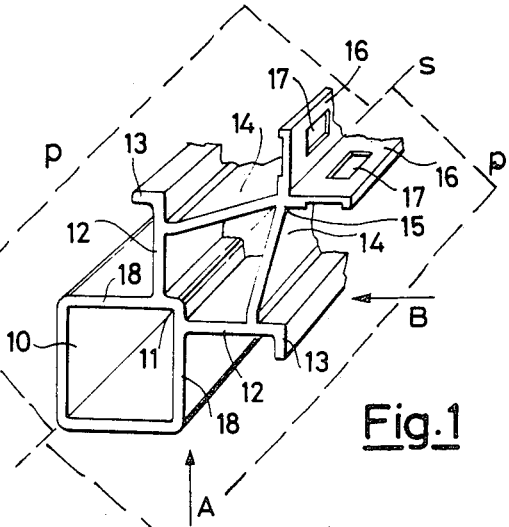
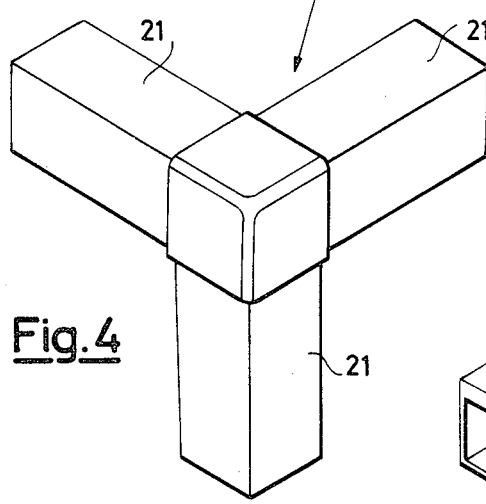
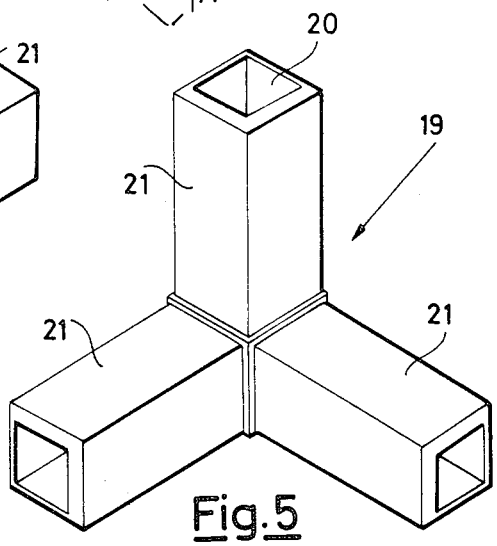

MODULAR ELEMENTS FOR COMPOSING FRAMES FOR THE CONSTRUCTION OF CABINET STRUCTURES AND CONTAINERS FOR ELECTRICAL, ELECTROMECHANICAL AND ELECTRONIC COMPONENTS, FOR INTERNAL AND EXTERNAL USE

This invention relates to modular elements for composing frames for the construction of cabinet structures and containers for electrical, electromechanical and electronic components, for internal and external use.

There currently exist various types of standardised elements for composing cabinet structures and containers for electrical, electromechanical and electronic components. However, they basically comprise welds in their corners for connecting the section bars to the angle pieces, thus involving complicated and lengthy operations in assembling the cabinets, because when these are finished they must be extremely stable and have their component fixing holes perfectly aligned to allow proper use.

Other cabinets for this purpose comprise both modular section bars and modular angle pieces in order to enable the purchaser to carry out his own assembly. However there exist a great many such standardised elements which are all different from each other and each is designed to construct a particular type of cabinet, with the result that the modularity is purely theoretical in that any slight variation in the cabinet dimensions means that all the elements have to be changed for others of different form. In addition, the manufacturers of currently available cabinets state that their sealing efficiency is rather low, and they are therefore not suitable for outdoor use with the exception of some which are of very special non-series construction, and are therefore also very costly.

The main object of the invention is to provide a type of element for composing a frame for the construction of cabinet structures which requires no welding between the angle pieces and section bars during assembly, but only mutual insertion joints which can be secured by means of rivets or screws. A further object of the invention is to provide section bars and angle pieces having a standard configuration for any cabinet to be constructed, the only constructional variations being in the elements which form the joining frame, and also providing separation between two cabinets constructed in a single block, or division within one cabinet.

According to the invention, the section bars form not only the cabinet framework, but also the support for its covering (walls, base, roof), and also for the door, and for the various containers to 19" standard.

A further advantage of the invention is that the door hinge points and the points at which the coverings are screwed to the frame are external to the seal gaskets, so as not to communicate with the cabinet interior and thus ensure excellent sealing against any external agent.

These and further objects which will be more apparent hereinafter are attained according to the invention by modular elements for composing cabinet structures and containers for electrical, electromechanical and electronic components, for internal and external use, the elements forming the perimetral cabinet frame defined by section bars and angle pieces connected together, characterised in that the angle pieces are constituted by a corner portion from which there extend several mutually orthogonal tube portions of substantially quadrilateral cross-section; the section bars are constituted by tubular elements arranged for insertion into said tube portions, from at least one of its corners there extending in mutually orthogonal directions two flanges from which there extend two further converging flanges, from which there extend two mutually orthogonal profiled portions provided with standardised holes arranged to support said containers for electronic use in accordance with the DIN 41494 19" system.

The elements according to the invention are described hereinafter with reference to the accompanying drawings, in which:

FIG. 1 is a perspective view of the section bar according to the invention;

FIGS. 2 and 3 are views in the directions A and B of the section bar of FIG. 1;

FIGS. 4 and 5 are views of two angle pieces according to the invention taken from two opposite sides and mutually rotated through 180°;

FIG. 6 is a plan view of the fitting-together of two section bars and one angle piece;

Figure 8:
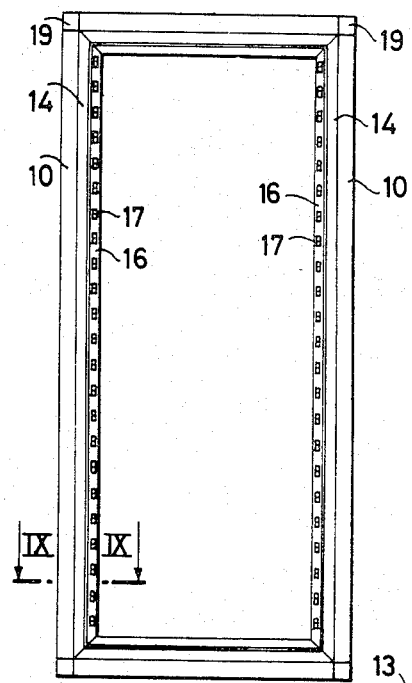
FIG. 8 is a front view of a cabinet.

The section bar according to the invention comprises a core 10 of hollow quadrilateral cross-section and of length variable according to requirements. From one of its corners 11 there extend two mutually perpendicular flanges 12 with their ends 13 bent parallel to those sides 18 of the core 10 which define the corner 11. Substantially from the centre line of the flanges 12 there extend two further flanges 14 which converge into a point 15 on the ideal prolongation S of the diagonal of the core 10 passing through the corner 11.

From said point 15 there extend two profiled portions 16 with standardised holes for supporting electrical, electromechanical and electronic components.

The flanges 12, 14 and the profiled portions 16 extend over the entire length of the section bar 10, however at their ends they are cut along two planes p passing through the two sides 18 and inclined at 45° to the plane passing through the end cross-section of the core 10, and further intersecting along the axis s (see FIGS. 1, 2, 3).

This particular end configuration of the section bars means that angle pieces 10 of the type shown in FIGS. 4 and 5 can be inserted into them. These angle pieces are constituted by a tube hollow at 20 and comprising three (see FIGS. 4 and 5), two, four or five mutually orthogonal branches 21 onto which the core 10 of each section bar is inserted, as shown in FIG. 6. When the section bars have been inserted onto said angle pieces 19, they can be fixed together for example by plates 22 riveted at 23, or other similar means (see FIG. 7). One side of the constructed frame will therefore appear as shown in FIG. 8, i.e. complete and final.

Figure 9:
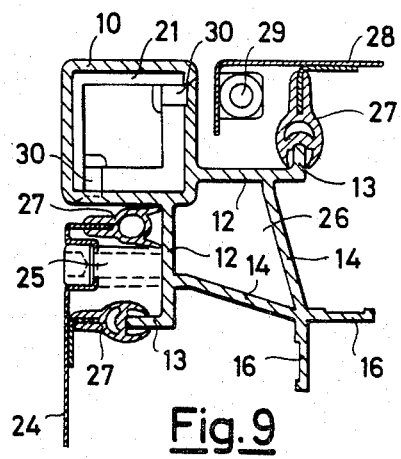
FIG. 9 is a section on the line IX—IX of FIG. 8.

With regard to the coverings and seal gaskets, as shown in FIG. 9 a side or rear wall 24 (but this also applies to the roof and base) is fitted to the section bar 10 by screws 29 screwed into the flange 12 but projecting into the space 26 defined between the flanges 12 and flanges 14, this space not communicating with the cabinet interior. A first seal is provided by means of embracing gaskets 27 between the wall 24 and edge 13, and a second seal is provided by the same gaskets 27 between the wall 24 and flange 12, beyond the screw 25.

With reference to the door 28, the seal between the door 28 and edge 13 is made by the gasket 27, and the hinge 29 which hinges the door to the roof and base is of conventional type.

Figure 7:
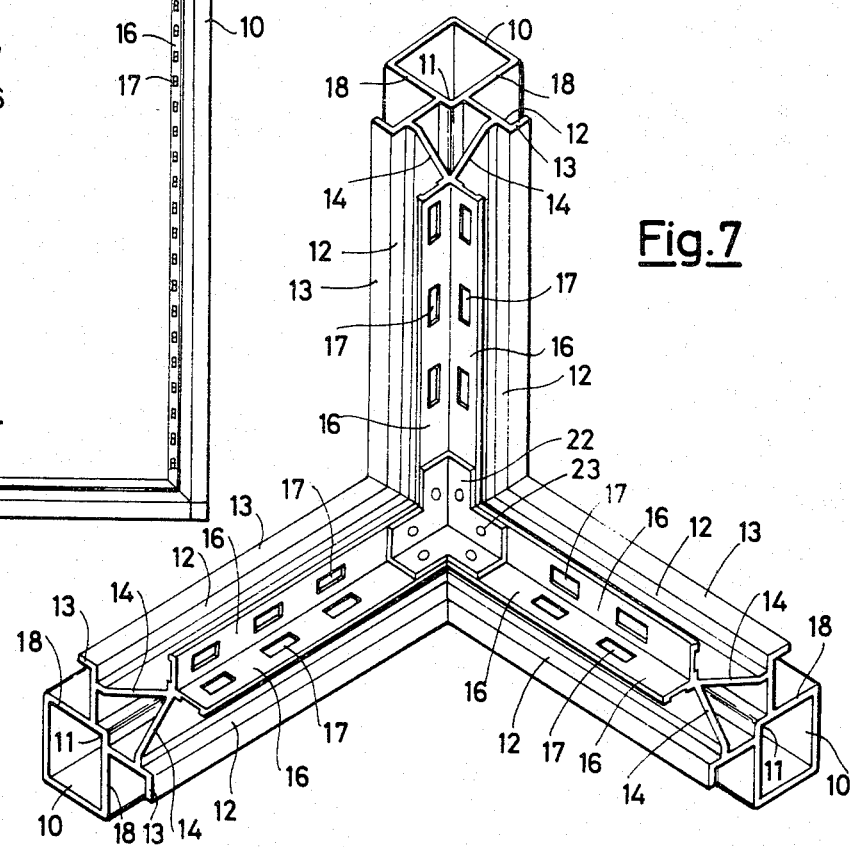
FIG. 7 is an internal view of an assembled corner.

FIG. 9 shows screws or rivets 30 which serve for further fixing the section bars 10 to the angle pieces 19, in addition to the plates 22 of FIG. 7.

Figure 10:
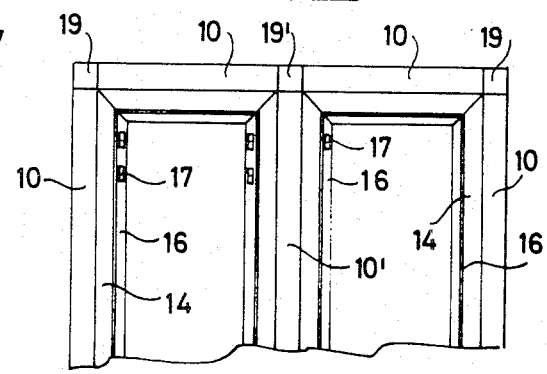
FIG. 10 is a partial view of a double cabinet.
Figure 11:
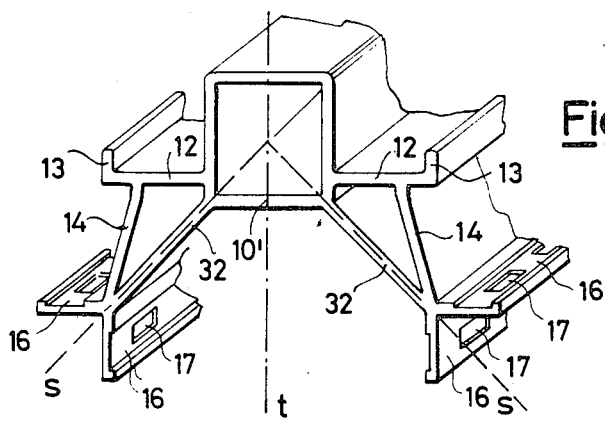
FIG. 11 is a perspective view of a section bar according to the invention for constructing the joining frame of a double cabinet.

Using the section bar according to the invention, it is possible to also construct double, triple and other cabinets as shown in FIG. 10, in which the only modification is the central frame 10' which separates and joins together the two cabinets, and is constructed in this case by means of the section bar of FIG. 11; as can be seen, it represents in practice the section bar of FIG. 1 but with doubling of the flanges 12, 14 and of the profiled portions 16, which are disposed specularly about the axis t passing through the end cross-section of the section bar 10'. As in the case of the section bar of FIG. 1, the flanges 12, 14 in this case are also cut along planes p which intersect along the axes s (FIG. 1) and along the axis r.

In this specific case, the inner flanges 12, 14 of each pair are combined into a single flange 32 passing through said axis s, thus simplifying the construction of the section bar.

Figure 12:
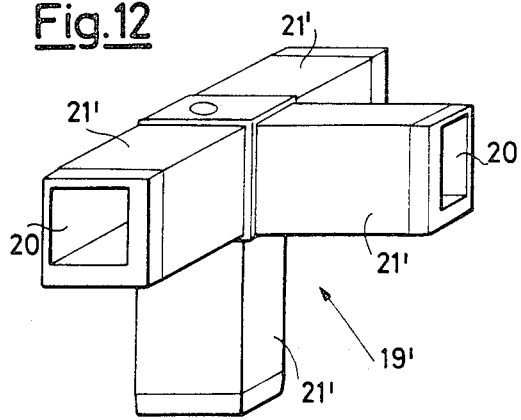
FIG. 12 is a view of an angle piece for use with the section bar of FIG. 11.
Figure 13:
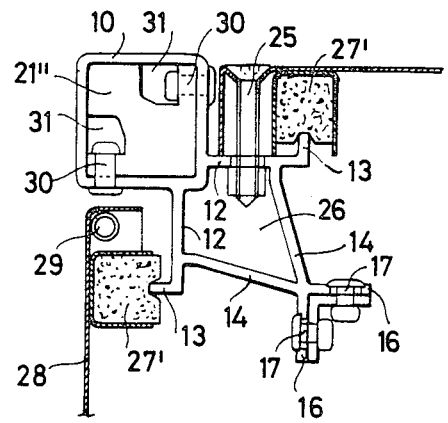
FIGS. 13, 14 and 15 are modifications of FIGS. 9, 5 and 4 respectively, which are for the same application as these latter, they being based on the same inventive concept.
Figure 14:
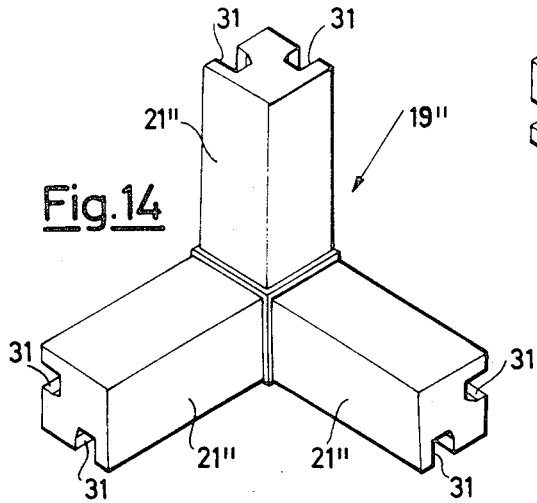
Figure 15:
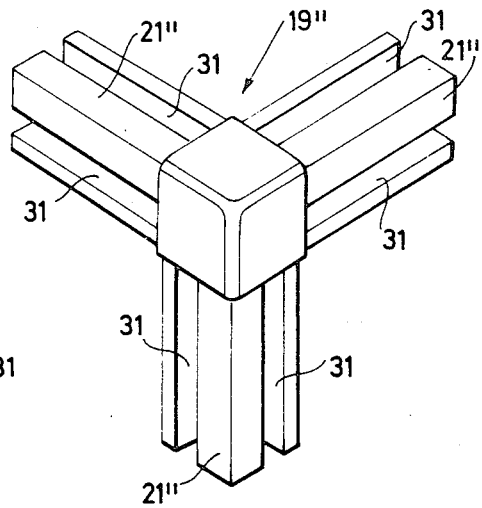

In contrast to the form of that shown in FIGS. 4 and 5, the angle piece 19' of FIG. 12 comprises four branches 21', of which one is designed for insertion into the section bar 10'. The other three branches 21' are designed for insertion into the section bars 10 of the type shown in FIG. 1, as also shown in FIG. 10. FIG. 13 shows a modification of FIG. 9, in which in addition to a different type of seal 27', there is a different type of angle piece 19'' compared with the angle pieces of FIGS. 4, 5 and 12. The angle piece 19'' is shown in FIGS. 14 and 15, in which it can be seen that instead of being hollow it comprises longitudinal slots 31 which allow the fixing of the rivets or screws 30 (FIG. 15), so attaining the same object and advantages as the embodiment of FIG. 9.

These modifications fall within the scope of the invention, and maintain its advantages and objects as also protected by the following claims.

I claim:

1. Modular elements for composing frames for the construction of cabinet structures and containers for electrical, electromechanical and electronic components, for internal and external use, said elements forming the perimetral cabinet frame defined by section bars and angle pieces connected together, characterised in that the angle pieces are constituted by a corner portion from which there extend several mutually orthogonal tube portions of substantially quadrilateral cross-section; each of said section bars comprising a tubular element of orthogonal shape arranged for insertion onto one of said tube portions and further comprising, extending from one corner thereof in mutually orthogonal directions, two flanges from which there extend two further converging and intersecting flanges, from which intersection there extend two mutually orthogonal profiled portions being provided with means arranged for supporting electronic and electromechanical containers.

2. Elements as claimed in claim 1, characterised in that the intersection of said second mentioned flanges defines a point on a straight line representing the prolongation of that diagonal of the tubular element of the section bar which passes through the corner from which the first mentioned two flanges extend.

3. Elements as claimed in claim 2, characterised in that at their ends each of the flanges are cut along first planes which pass through the sides embracing the corner from which the flanges extend, and which form an angle of 45° with the plane orthogonal to the section bar axis: said first planes intersecting along said straight line.

4. Elements claimed in claim 1, characterised in that said first mentioned flanges extending from the tubular element comprise end edges bent parallel to those sides of the tubular element which define said corner.

5. Elements as claimed in claim 1, characterised in that the first and second mentioned flanges and the profiled portions with standardised holes extend from two adjacent corners of the section bar.

6. Elements as claimed in claim 5, characterised in that the two facing flanges of the first mentioned pair of flanges mate over a first portion which extends from the tubular element.

7. Elements as claimed in claim 5, characterised in that the two facing flanges of the first mentioned pair of flanges lie on said straight line.

8. Elements as claimed in claim 1, characterised in that the tube portions of the angle piece are hollow.

9. Elements as claimed in claim 1, characterised in that the tube portions of the angle piece are longitudinally slotted.

* * * * *